(12) United States Patent
Yang

(10) Patent No.: US 7,540,918 B2
(45) Date of Patent: Jun. 2, 2009

(54) ATOMIC LAYER DEPOSITION EQUIPMENT AND METHOD

(75) Inventor: Taek-Seung Yang, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 136 days.

(21) Appl. No.: 11/609,862

(22) Filed: Dec. 12, 2006

(65) Prior Publication Data

US 2007/0134823 A1    Jun. 14, 2007

(30) Foreign Application Priority Data

Dec. 14, 2005    (KR) .................. 10-2005-0123319

(51) Int. Cl.
*C30B 25/00*    (2006.01)

(52) U.S. Cl. ..................................... 117/86
(58) Field of Classification Search .............. None
See application file for complete search history.

(56) References Cited

U.S. PATENT DOCUMENTS 7,153,362 B2*  12/2006  Ko et al. .................. 117/86
2003/0200924 A1* 10/2003  Ko et al. .................. 118/715

* cited by examiner

*Primary Examiner*—Scott B. Geyer
*Assistant Examiner*—Andre' C Stevenson
(74) *Attorney, Agent, or Firm*—Sherr & Vaughn, PLLC

(57) ABSTRACT

An ALD (Atomic Layer Deposition) apparatus includes a chamber with a sample seated in the reaction space, a supply line providing a raw material gas, an exhaust line through which a reaction gas is exhausted, and a mass analyzer for detecting reaction gases generated within the chamber.

10 Claims, 2 Drawing Sheets

ATOMIC LAYER DEPOSITION EQUIPMENT AND METHOD

The present application claims priority under 35 U.S.C. 119 and 35 U.S.C. 365 to Korean Patent Application No. 10-2005-0123319 (filed on Dec. 14, 2005), which is hereby incorporated by reference in its entirety.

BACKGROUND

In general, thin film manufacturing methods such as chemical vapor deposition (CVD), atomic layer deposition (ALD) and the like are used to deposit a thin film with a predetermined thickness over a substrate such as a semiconductor wafer or glass. Among these methods, ALD has been expected to be a next-generation method of depositing a thin film, because the ability to control the deposition process is excellent. In an ALD process, a chemically reactive gas is supplied to deposition equipment, in a similar fashion to CVD. When a film is deposited by CVD, all reaction substances together form a thin film when exposed to the surface of a wafer. When a film is deposited by the ALD method, reaction substances are separately supplied in pulses, and isolated from one another by a purge gas. The pulse of each reaction substance causes a delicate single-layered film growth by causing a chemical reaction with the surface of a wafer. Since the ALD method has the advantage of self-limiting reactions, a precise film thickness control may be realized.

Referring to FIG. 1, the ALD equipment 110 includes: a chamber 111 containing a sample 100 such as a wafer positioned therein, the chamber defining a reaction space above the sample 100; a supply line 112 through which a raw material gas is supplied into the reaction space; and an exhaust line 113 through which a reaction gas within the reaction space of the chamber 111 is exhausted to a pumping system. In the drawing, arrows within the chamber 111 indicate the movement of gas.

When a thin film is deposited, the ALD equipment does not collect or produce information on reactions occurring within the chamber during the deposition process. The resulting thin film substance may be identified through various physical property measurements only after the deposition has been ended. Accordingly, precise process control during thin film deposition, e.g., control of raw material supply or a thin film property is made more difficult.

SUMMARY

Embodiments relate to ALD (Atomic Layer Deposition) equipment and ALD methods in manufacturing semiconductor devices. Embodiments relate to ALD equipment or apparatus wherein reactions are monitored during the thin film deposition process so that precise process control can be achieved. Embodiments relate to an ALD method using the ALD equipment allowing reactions to be monitored.

Embodiments relate to ALD (Atomic Layer Deposition) equipment, which include: a chamber containing a sample seated therein and defining a reaction space above the sample; a supply line through which a raw material gas is supplied into the chamber; an exhaust line through which a reaction gas within the chamber is exhausted; and a mass analyzer for detecting gases generated within the chamber. The mass analyzer may be a QMA (Quadrupole Mass Analyzer). The mass analyzer may be positioned such that it can detect the gases near the edge of the sample adjacent to the exhaust line. The mass analyzer may be positioned such that it can detect the gases at the entrance of the exhaust line.

Embodiments relate to an ALD method including: loading a sample within a chamber; supplying a raw material gas into the chamber to deposit a thin film over the sample, wherein the film may be just one atom or molecular layer thick; using a mass analyzer to determine whether or not reaction gases are detectable within the chamber; continuing the supply of the raw material gas while the reaction gas is detected, and discontinuing the supply of the raw material gas when the reaction gas is not detected but the raw material gas is detected.

BRIEF DESCRIPTION OF THE DRAWINGS

Example

Example

Example

DETAILED DESCRIPTION

Figure 1:
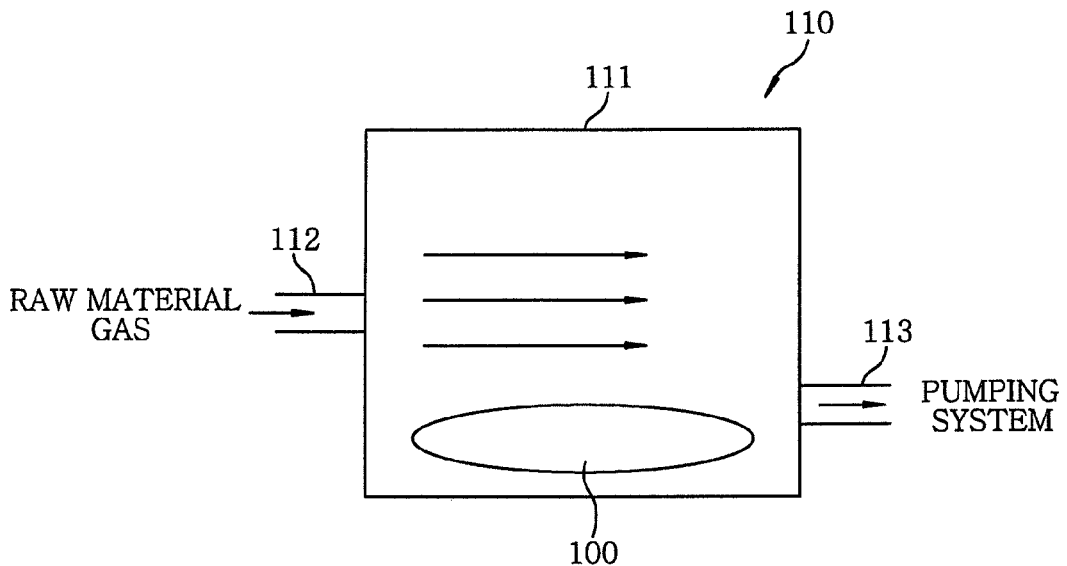
FIG. 1 is a drawing that schematically shows ALD equipment.
Figure 2:
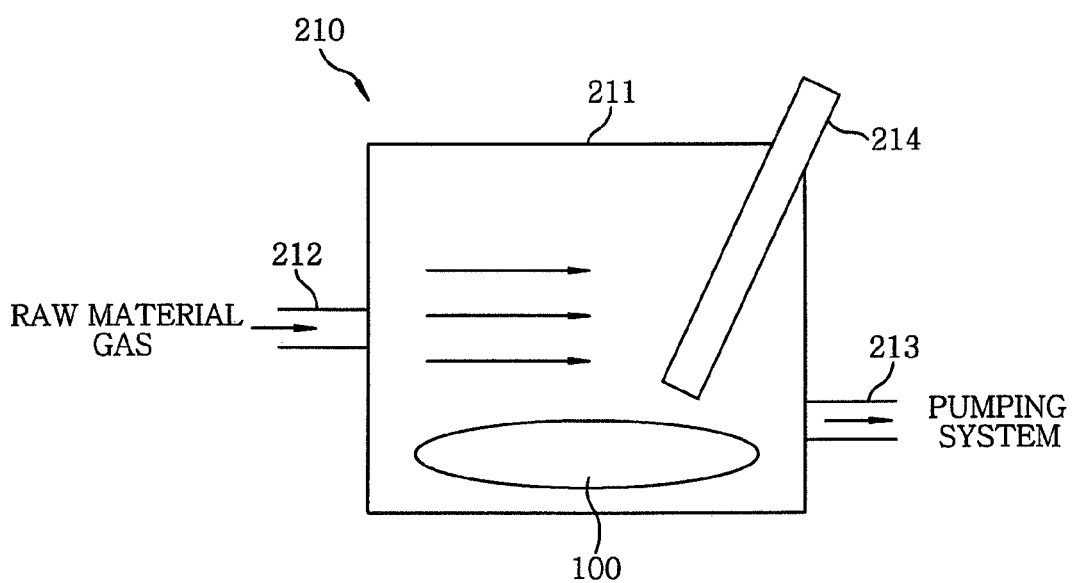
FIG. 2 is a drawing that shows an ALD equipment with a QMA near the edge of the sample adjacent to the exhaust line, in accordance with embodiments.

Referring to FIG. 2, the ALD equipment 210 includes a chamber 211 containing a sample 100, such as a wafer, positioned therein and defining a reaction space above the sample 100. Arrows drawn within the chamber 211 indicate the movement of gas. The gas may be divided into a raw material gas and a reaction gas. The term raw material gas designates a precursor material of a thin film, and the term reaction gas designates a gas generated by the reaction of the raw material gas with a surface of the sample 100. A supply line 212 through which the raw material gas is supplied into the reaction space is connected to the chamber 211. An exhaust line 213 conducts the reaction gas within the chamber 211 to a pumping system. A mass analyzer 214 is positioned in the chamber 211 such that a reaction mechanism occurring within the chamber 211 can be monitored by detecting the associated reaction gasses.

The mass analyzer 214 may be a QMA (Quadruple Mass Analyzer) that analyzes the mass/charge ratio of a gas. The mass analyzer 214 is positioned near the edge of the sample 100 within the chamber 211 to detect gas at the edge thereof. Particularly, the mass analyzer 214 is positioned at the edge of the sample 100 adjacent to the exhaust line 213.

The mass analyzer 214 monitors the reaction mechanism within the chamber 211 during the thin film deposition process. More specifically, when an excessive amount of the raw material gas is injected into the chamber 211, it reacts to the surface of the sample 100 in the ADL mechanism. When the reaction is saturated, the remaining raw material gas is exhausted through the exhaust line 213. As shown by the arrows in the drawing, the gases contained in the chamber 211 and the exhaust line 213, are therefore largely composed of a gas generated after the raw material gas has reacted to the surface of the sample 100 and a gas which has not reacted, i.e., a gas exhausted without reacting to the sample 100 when the reaction is saturated by injecting an excessive amount of the raw material.

When the ALD reaction is in progress, the gases detected by the mass analyzer 214 contain, along with the raw material gas, the reaction gases generated by the reaction of the raw material gas to surface of the sample 100. When the ALD reaction is saturated and then completed, only the mass of raw material substances is measured in the gases detected by the mass analyzer 214. Accordingly, the measurements of the mass of the reaction gases are fed back to produce control signals to the supply line 212. Specifically, as long as the reaction gases are continuously measured, the supply line 212 is kept open. When mass analyzer 214 does not detect the reaction gases, the supply line 212 is closed since the supply of raw material is now unnecessary. In this way, the reaction conditions within the chamber 211 are monitored in real time using the mass analyzer 214 so that ALD reactions and the raw material supply can be controlled precisely. Furthermore, information on the ALD mechanism occurring on the surface of the sample 100 can also be obtained through the mass analysis of the reaction gases.

Figure 3:
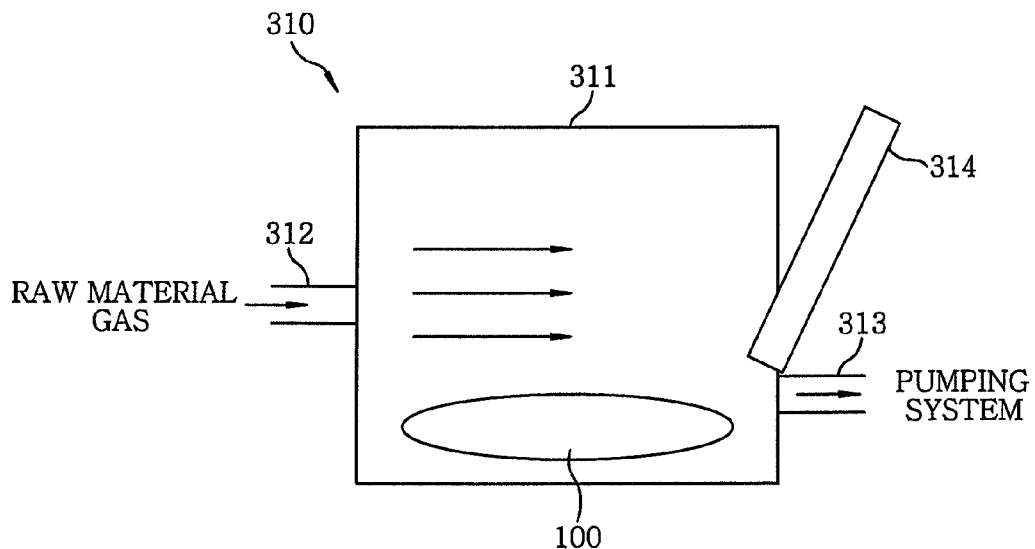
FIG. 3 is a drawing that shows an ALD equipment with a QMA at the entrance of the exhaust line, in accordance with embodiments.

Referring to FIG. 3, the ALD equipment 310 is similar to the ALD equipment described with respect to 210 of FIG. 2, in that the ALD equipment 310 includes a chamber 311, a supply line 312, an exhaust line 313 and a mass analyzer 314. However, the ALD equipment 310 is different in that the mass analyzer 314 is positioned closely to the exhaust line 313. That is, the mass analyzer 314 may be positioned to largely detect gases exhausted through the exhaust line 313.

Figure 4:
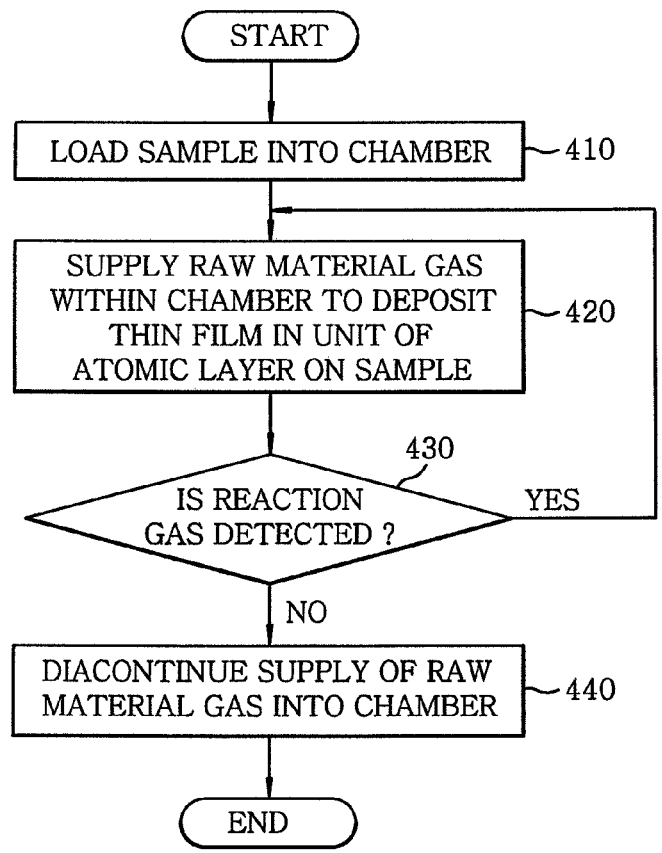
FIG. 4 is a flowchart illustrating an ALD method using an ALD equipment, in accordance with embodiments.

Referring to FIG. 4, a sample 100 is loaded within a chamber 211 or 311 (step 410). Next, a raw material gas is supplied into the chamber 211 or 311 such that a thin film, which may be a single atom or molecular layer thick, is deposited over the sample 100 (step 420). Then, the gas within the chamber 211 or 311 is sampled using a mass analyzer 214 or 314 (step 430) to detect a reaction gas. If reaction gases are detected, this means that the thin film deposition process is still in progress, and the supply of the raw material gas is therefore continued through a supply line 212 or 312. However, if only raw material gas devoid of reaction gases is detected, this means that the thin film deposition process is complete and the ALD reaction is saturated, so the supply of the raw material gas is discontinued by blocking the supply line 212 or 312 (step 440).

As described above, a reaction mechanism during a thin film deposition process can be advantageously monitored by detecting the gases within the chamber using a mass analyzer. The process may therefore be more precisely and efficiently controlled by feeding the monitored results back into the process.

It will be obvious and apparent to those skilled in the art that various modifications and variations can be made in the embodiments disclosed. Thus, it is intended that the disclosed embodiments covers the obvious and apparent modifications and variations, provided that they are within the scope of the appended claims and their equivalents.

What is claimed is:

1. An apparatus comprising:
   a chamber configured to process a sample;
   a supply line through which a raw material gas is supplied into the chamber;
   an exhaust line through which a reaction gas within the chamber is exhausted; and
   a mass analyzer for detecting gases generated within the chamber, wherein the mass analyzer is positioned in the chamber adjacent to the exhaust line.

2. The apparatus of claim 1, wherein the apparatus is an atomic layer deposition apparatus.

3. The apparatus of claim 1, wherein the chamber seats the sample and the chamber comprises a reaction space above the sample.

4. The apparatus of claim 1, wherein the mass analyzer is a quadrupole mass analyzer.

5. A method comprising:
   loading a sample into a chamber;
   supplying a raw material gas into the chamber to deposit a film on the sample; and then
   detecting gases within the chamber using a mass analyzer positioned adjacent to an edge of the sample, wherein the mass analyzer is positioned in the camber adjacent to the exhaust line.

6. The method of claim 5, wherein the method is performed in an atomic layer deposition apparatus.

7. The method of claim 5, further comprising determining if a reaction gas is detected after detecting gases.

8. The method of claim 7, further comprising continuing to supply the raw material gas if the reaction gas is detected.

9. The method of claim 7, further comprising discontinuing supply of the raw material gas if the reaction gas is not detected and the raw material gas is detected.

10. The method of claim 5, wherein the film has a thickness of a single atomic or molecular layer.

* * * * *

UNITED STATES PATENT AND TRADEMARK OFFICE
CERTIFICATE OF CORRECTION

PATENT NO.         : 7,540,918 B2                                                Page 1 of 1
APPLICATION NO.    : 11/609862
DATED              : June 2, 2009
INVENTOR(S)        : Taek-Seung Yang It is certified that error appears in the above-identified patent and that said Letters Patent is hereby corrected as shown below:

In the claims, column 4, line 31, claim 5 (at line 7) should be corrected in order that the term "camber" recites --chamber.--

Signed and Sealed this

Fifteenth Day of September, 2009

David J. Kappos
*Director of the United States Patent and Trademark Office*